(12) United States Patent
Yamamoto et al.

(10) Patent No.: US 10,532,422 B2
(45) Date of Patent: Jan. 14, 2020

(54) CLAD MATERIAL AND ELECTRONIC DEVICE HOUSING

(71) Applicant: HITACHI METALS, LTD., Tokyo (JP)

(72) Inventors: Shinji Yamamoto, Suita (JP); Ryoji Inoue, Suita (JP)

(73) Assignee: HITACHI METALS, LTD., Tokyo (JP)

(*) Notice: Subject to any disclaimer, the term of this patent is extended or adjusted under 35 U.S.C. 154(b) by 173 days.

(21) Appl. No.: 15/543,628

(22) PCT Filed: Dec. 15, 2016

(86) PCT No.: PCT/JP2016/087352
§ 371 (c)(1),
(2) Date: Jul. 14, 2017

(87) PCT Pub. No.: WO2017/115661
PCT Pub. Date: Jul. 6, 2017

(65) Prior Publication Data
US 2018/0326530 A1   Nov. 15, 2018

(30) Foreign Application Priority Data
Dec. 28, 2015   (JP) .................................. 2015-256343

(51) Int. Cl.
| | | |
|---|---|---|
| *B32B 15/01* | (2006.01) | |
| *B23K 20/04* | (2006.01) | |
| *B23K 35/30* | (2006.01) | |
| *H05K 5/04* | (2006.01) | |
| *B23K 103/08* | (2006.01) | |
| *B23K 103/10* | (2006.01) | |

(52) U.S. Cl.
CPC ............ *B23K 20/04* (2013.01); *B23K 35/302* (2013.01); *B32B 15/017* (2013.01); *H05K 5/04* (2013.01); *B23K 2103/10* (2018.08); *B23K 2103/15* (2018.08); *Y10T 428/12347* (2015.01)

(58) Field of Classification Search
None
See application file for complete search history.

(56) References Cited

U.S. PATENT DOCUMENTS 3,475,140 A * 10/1969 Russell ................ B32B 15/017
101/458

FOREIGN PATENT DOCUMENTS

| CN | 101530860 A | 9/2009 |
|---|---|---|
| JP | 6-328617 A | 11/1994 |
| JP | 2003181975 A * | 7/2003 |

(Continued)

OTHER PUBLICATIONS

English machine translation of JP06-328617A dated Feb. 27, 2019 (3 pages) (Year: 2019).*

(Continued)

*Primary Examiner* — Adam Krupicka
(74) *Attorney, Agent, or Firm* — Westerman, Hattori, Daniels & Adrian, LLP

(57) ABSTRACT

This clad material includes a first layer made of a Mg—Li base alloy, a second layer made of an Al base alloy, and a first bonding portion arranged on a bonding interface between the first layer and the second layer in a section view when cut in a thickness direction and made of a Cu base alloy. The clad material has a specific gravity of 2.10 or less.

9 Claims, 9 Drawing Sheets

(56) References Cited

FOREIGN PATENT DOCUMENTS

| | | |
|---|---|---|
| JP | 2005-281824 A | 10/2005 |
| JP | 2014-13467 A | 1/2014 |
| JP | 2015-202680 A | 11/2015 |
| JP | 5830727 B2 * | 12/2015 ........... B23K 20/023 |
| WO | 2011/155214 A1 | 12/2011 |

OTHER PUBLICATIONS

English machine translation of JP2003-181975A dated Feb. 27, 2019 (8 pages) (Year: 2019).*
English machine translation of JP58-30727 dated Feb. 28, 2019 (22 pages) (Year: 2019).*
International Search Report dated Feb. 7, 2017, issued in counterpart International Application No. PCT/JP2016/087352 (2 pages).
Office Action dated Feb. 23, 2018, issued in counterpart Chinese Application No. 201680005863.5, with English translation. (12 pages).

* cited by examiner

FIG.7 EXAMPLE 2
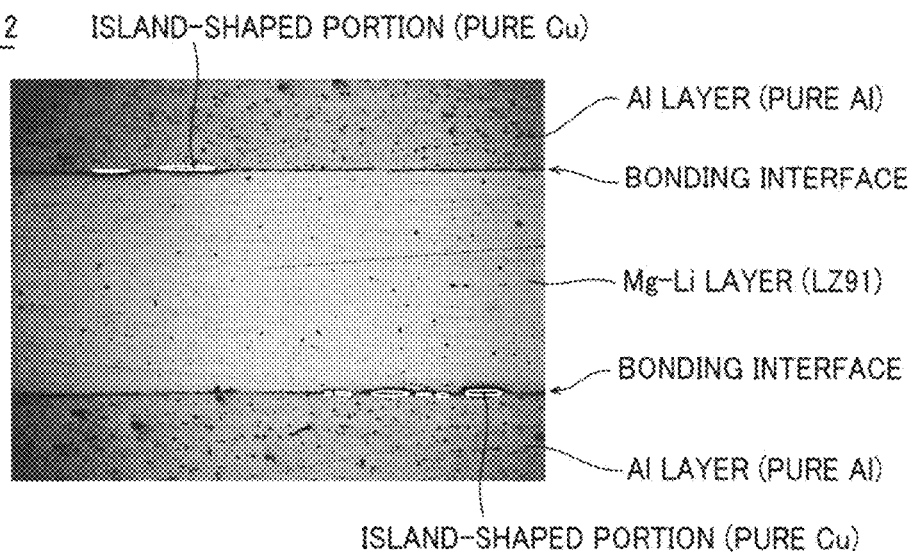
FIG.8 EXAMPLE 3
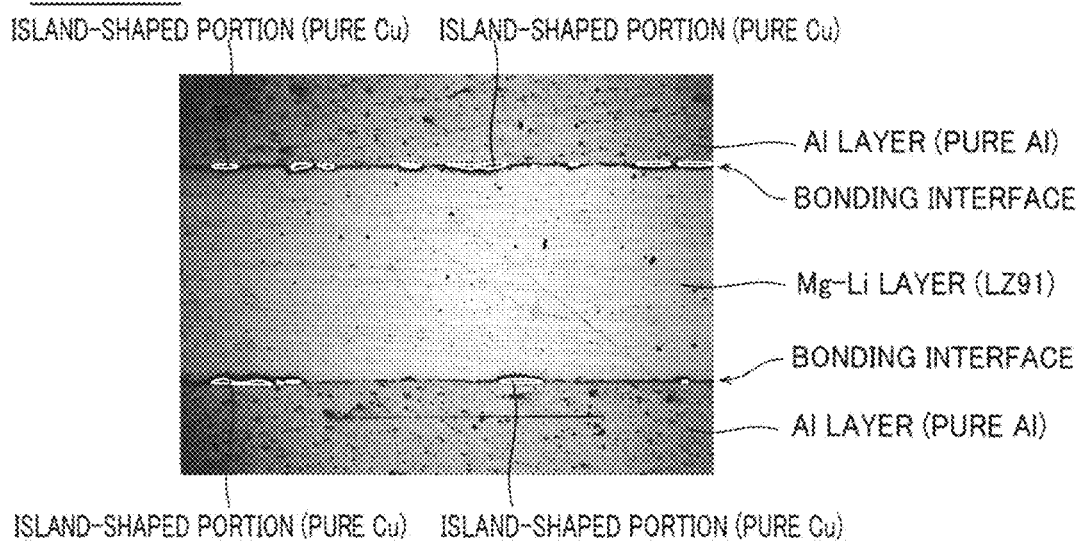

FIG. 13
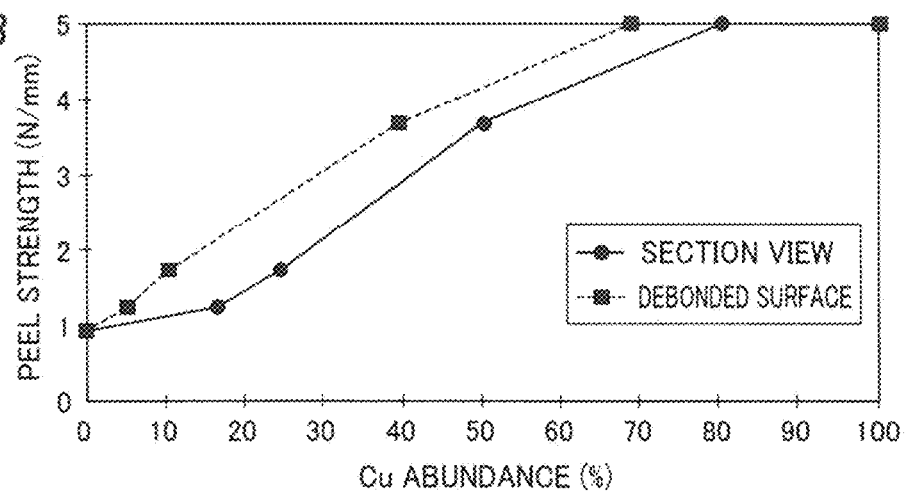
FIG. 14 EXAMPLE 1
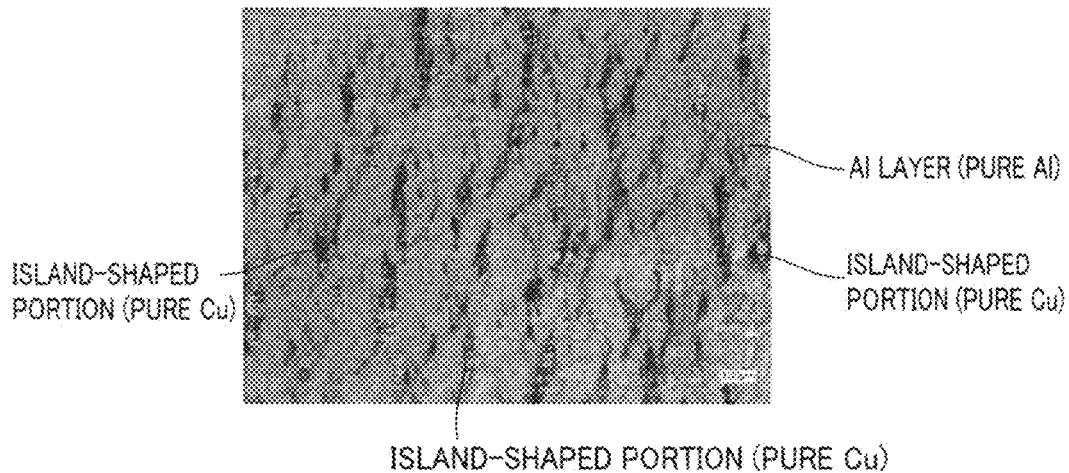
FIG. 15 EXAMPLE 2
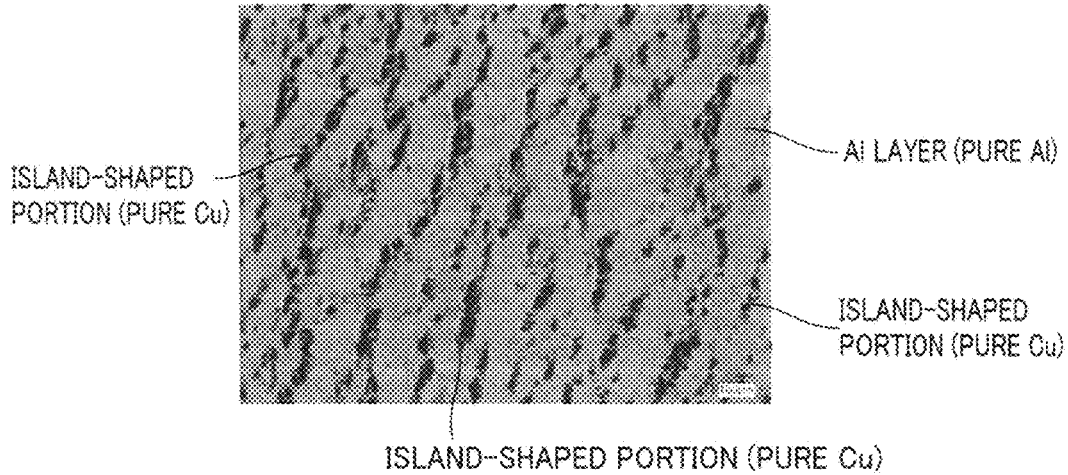

CLAD MATERIAL AND ELECTRONIC DEVICE HOUSING

TECHNICAL FIELD

The present invention relates to a clad material and an electronic device housing made of the clad material.

BACKGROUND ART

A Mg (magnesium) base alloy is currently known as a lightweight material used for a housing or the like of a portable terminal. However, there is such a disadvantage that the Mg base alloy is low in corrosion resistance. Thus, it is studied that a clad material in which a layer made of the Mg base alloy and a layer made of an Al (aluminum) base alloy are bonded to each other is prepared such that a material in which an Al base alloy enables improvement in corrosion resistance while a Mg base alloy enables weight saving is obtained.

However, when the clad material is prepared by directly bonding the layer made of the Mg base alloy and the layer made of the Al base alloy to each other, a fragile intermetallic compound is deposited on a bonding interface between the layers, and hence there is such a disadvantage that the layers are likely to be separated from each other.

In order to suppress the separation of the layers, a clad material in which a layer made of a Mg base alloy and a layer made of an Al base alloy are bonded to each other through a layer made of Cu is known in general. Such a clad material is disclosed in International Patent Application Publication 2011/155214, for example.

International Patent Application Publication 2011/155214 discloses a combined member including a magnesium member made of an alloy that mainly contains Mg, an aluminum member made of an alloy that mainly contains Al, and an intermediate layer arranged between the magnesium member and the aluminum member and made of Cu. International Patent Application Publication 2011/155214 also discloses a combined member in which a magnesium alloy billet made of AZ80 that contains 8 mass % of Al, less than 1 mass % of Zn, the balance Mg, and inevitable impurity elements, an insert material made of Cu, and an aluminum alloy billet made of A6151 are bonded to each other as an example.

PRIOR ART DOCUMENT

Patent Document

Patent Document 1: International Patent Application Publication 2011/155214

SUMMARY OF THE INVENTION

Problems to be Solved by the Invention

However, in the combined member described in International Patent Application Publication 2011/155214, the specific gravity of AZ80 is about 1.80, which is large, and hence there is such a problem that AZ80 is bonded to Cu and A6151, both of which have a larger specific gravity than AZ80, such that the specific gravity of the combined member is likely to be increased. Furthermore, AZ80 is not easily bonded to Cu, and hence there is also conceivably such a problem that the bonding strength on a bonding interface therebetween cannot be sufficiently ensured.

The present invention has been proposed in order to solve the aforementioned problems, and an object of the present invention is to provide a clad material capable of sufficiently ensuring the bonding strength on its bonding interface while suppressing an increase in its specific gravity and an electronic device housing using the clad material.

Means for Solving the Problems

As a result of earnest investigations to solve the aforementioned problems, the present inventors have found that a lightweight Mg—Li base alloy that contains Li in addition to Mg is easily bonded to a Cu base alloy. The present inventors also have found that the aforementioned problems can be solved by the following structure. That is, a clad material according to a first aspect of the present invention includes a first layer made of a Mg—Li base alloy, a second layer made of an Al base alloy, and a first bonding portion arranged on a bonding interface between the first layer and the second layer in a section view when cut in a thickness direction and made of a Cu base alloy, and the clad material has a specific gravity of 2.10 or less.

The "Mg—Li base alloy" according to the present invention denotes an alloy that mainly contains Mg and Li, and also includes an alloy that slightly contains another element in addition to Mg and Li. For example, the "Mg—Li base alloy" according to the present invention includes a Mg—Li—Zn alloy that slightly contains Zn in addition to Mg and Li, a Mg—Li—Al alloy that slightly contains Al in addition to Mg and Li, a Mg—Li—Al—Zn alloy that slightly contains Zn and Al in addition to Mg and Li, etc. The Mg—Li—Zn alloy includes a Mg-9Li-1Zn alloy etc., the Mg—Li—Al alloy includes a Mg-14Li-1Al alloy etc., and the Mg—Li—Al—Zn alloy includes a Mg-8Al-2Li-1Zn alloy etc. The "Al base alloy" according to the present invention includes pure Al in No. A1000s defined in JIS and an Al alloy such as an Al—Si alloy in No. A4000s or an Al—Mg alloy in No. A5000s. The "Cu base alloy" according to the present invention includes pure Cu such as C1020 (oxygen-free copper), C1100 (tough pitch copper), C1201 (phosphorous-deoxidized copper), or C1220 (phosphorous-deoxidized copper) defined in JIS and a Cu alloy such as a Cu—Ni alloy.

In the clad material according to the first aspect of the present invention, as hereinabove described, the layer (first layer) made of a Mg alloy is made of the Mg—Li base alloy such that the specific gravity of the first layer can be further reduced by the Mg—Li base alloy that contains Li as compared with the case where the layer made of a Mg alloy is made of AZ80. Thus, the specific gravity of the clad material is reduced to 2.10 or less such that an increase in the specific gravity of the clad material can be suppressed. Furthermore, the clad material includes an Al layer such that the corrosion resistance of the clad material can be increased. Consequently, the lightweight clad material having a high corrosion resistance can be obtained. In addition, the Mg—Li base alloy of which the first layer is made is easily bonded to the first bonding portion made of the Cu base alloy, and hence the bonding strength on the bonding interface is sufficiently ensured such that debonding of the first layer and the second layer from each other can be suppressed. This has been confirmed by a test described later. Furthermore, the structure of a second bonding portion described later preferably corresponds to the above structure of the first bonding portion.

In the aforementioned clad material according to the first aspect, the first bonding portion is preferably arranged in an island shape on the bonding interface. The term "island shape" denotes a state where fractures are formed in the first bonding portion such that the first bonding portion is not entirely connected. According to this structure, as compared with the case where the first bonding portion is layered on the entire bonding interface (a state where no fractures are formed in the first bonding portion such that the first bonding portion is entirely connected), the first bonding portion made of the Cu base alloy having a larger specific gravity than the Mg—Li base alloy and the Al base alloy can be reduced. Thus, the specific gravity of the clad material is reduced to 2.10 or less such that the clad material can be more reliably reduced in weight. The structure of the second bonding portion described later preferably corresponds to the above structure of the first bonding portion.

In this case, the first bonding portion is preferably arranged on 10% or more and 90% or less of the bonding interface in the section view. Furthermore, the first bonding portion is more preferably arranged on 20% or more and 80% or less of the bonding interface in the section view. According to this structure, the first bonding portion is arranged on 10% or more (more preferably 20% or more) of the bonding interface in the section view such that the bonding strength on the bonding interface can be reliably ensured. Furthermore, the first bonding portion is arranged on about 90% or less (more preferably about 80% or less) of the bonding interface in the section view such that an excessive increase in the first bonding portion made of the Cu base alloy having a larger specific gravity than the Mg—Li base alloy and the Al base alloy can be suppressed, and hence an increase in the specific gravity of the clad material can be suppressed. The structure of the second bonding portion described later preferably corresponds to the above structure of the first bonding portion.

In the aforementioned clad material according to the first aspect, a thickness of the first bonding portion in the section view is preferably 0.5 μm or more and 6 μm or less. The team "a thickness of the first bonding portion" denotes the mean thickness at a plurality of positions in the cross-section of the first bonding portion. In other words, when the first bonding portion is arranged in the island shape in the section view, assuming that the thickness of the first bonding portion at a position where no first bonding portion is arranged is zero, the mean thickness is acquired. According to this structure, the thickness of the first bonding portion is set to 0.5 μm or more in the section view such that the first bonding portion can be sufficiently ensured, and hence a reduction in the bonding strength on the bonding interface can be suppressed. Furthermore, the thickness of the first bonding portion is set to 6 μm or less in the section view such that an excessive increase in the first bonding portion made of the Cu base alloy having a larger specific gravity than the Mg—Li base alloy and the Al base alloy can be suppressed, and hence an increase in the specific gravity of the clad material can be suppressed. The structure of the second bonding portion described later preferably corresponds to the above structure of the first bonding portion.

In the aforementioned clad material according to the first aspect, a thickness of the first layer in the section view is preferably 60% or more and 90% or less of a thickness of the clad material. According to this structure, the thickness of the first layer in the section view is set to 60% or more of the thickness of the clad material such that the percentage of the Mg—Li base alloy having the smallest specific gravity among the Mg—Li base alloy, the Al base alloy, and the Cu base alloy can be sufficiently increased, and hence the clad material can be effectively reduced in weight. Furthermore, the thickness of the first layer in the section view is set to 90% or less of the thickness of the clad material such that insufficient ensuring of the thickness of the second layer is suppressed, and hence a reduction in the corrosion resistance of the clad material can be suppressed. The effect of the second layer is obtained as the effect of a third layer in the case where the third layer described later is provided.

In the aforementioned clad material according to the first aspect, a peel strength between the first layer and the first bonding portion is preferably 1.0 N/mm or more. The bonding strength between the second layer made of the Al base alloy and the first bonding portion made of the Cu base alloy is sufficiently larger than the bonding strength between the first layer made of the Mg—Li base alloy and the first bonding portion made of the Cu base alloy. Thus, according to the present invention, the peel strength between the first layer and the first bonding portion is set to 1.0 N/mm or more such that the bonding strength between the first layer and the second layer through the first bonding portion can be reliably ensured. The structure of the second bonding portion described later preferably corresponds to the above structure of the first bonding portion.

The aforementioned clad material according to the first aspect preferably further includes a third layer bonded to a surface of the first layer on a side opposite to the second layer and made of an Al base alloy and a second bonding portion arranged on a bonding interface between the first layer and the third layer in the section view and made of a Cu base alloy. According to this structure, the first layer having a low corrosion resistance is sandwiched by the second layer and the third layer made of the Al base alloys, and hence the corrosion resistance of the clad material can be effectively improved. Furthermore, the second bonding portion made of the Cu base alloy is arranged on the bonding interface between the first layer and the third layer such that the bonding strength on the bonding interface between the first layer and the third layer can be sufficiently ensured, similarly to the first bonding portion. In addition, the clad material has a layered structure symmetrical about the first layer, in which the second layer made of the Al base alloy, the first layer made of the Mg—Li base alloy, and the third layer made of the Al base alloy are stacked in this order, such that warpage in the clad material can be effectively suppressed. Thus, the clad material suitable for a member requiring flatness such as a housing can be provided.

In the aforementioned clad material according to the first aspect, the Mg—Li base alloy of which the first layer is made preferably contains 6 mass % or more and 15 mass % or less of Li. According to this structure, the Mg—Li base alloy contains 6 mass % or more of Li such that the content of Li in the Mg—Li base alloy can be sufficiently ensured, and hence the first layer can be sufficiently reduced in weight. Furthermore, the Mg—Li base alloy contains 6 mass % or more of Li such that the ductility of the first layer can be improved, and hence the press workability of the clad material can be improved. In addition, the Mg—Li base alloy contains 15 mass % or less of Li such that an increase in Li, which causes a reduction in corrosion resistance, contained in the Mg—Li base alloy can be suppressed, and hence the stability of the first layer can be ensured.

An electronic device housing according to a second aspect of the present invention is made of the aforementioned clad material. According to this structure, the lightweight electronic device housing having a high corrosion resistance can be obtained. Furthermore, the electronic device housing in which the bonding strength on the bonding interface of the clad material is sufficiently ensured can be obtained. Thus, the housing particularly suitable for a portable electronic device requiring reduction in weight can be provided.

Effect of the Invention

According to the present invention, as hereinabove described, the clad material capable of sufficiently ensuring the bonding strength on its bonding interface while suppressing an increase in its specific gravity and the electronic device housing using the clad material can be provided.

BRIEF DESCRIPTION OF THE DRAWINGS

FIG. 7 A sectional photograph of Example 2 in the cross-section observation conducted in order to confirm the effect of the present invention.

FIG. 8 A sectional photograph of Example 3 in the cross-section observation conducted in order to confirm the effect of the present invention.

FIG. 13 A graph showing the relationship between a Cu abundance and a bonding strength conducted in order to confirm the effect of the present invention.

FIG. 14 A photograph of a debonded surface according to Example 1 in the debonding test conducted in order to confirm the effect of the present invention.

FIG. 15 A photograph of a debonded surface according to Example 2 in the debonding test conducted in order to confirm the effect of the present invention.

MODES FOR CARRYING OUT THE INVENTION

Embodiments embodying the present invention are hereinafter described on the basis of the drawings.

First Embodiment

<Structure of Electronic Device>

Figure 1:
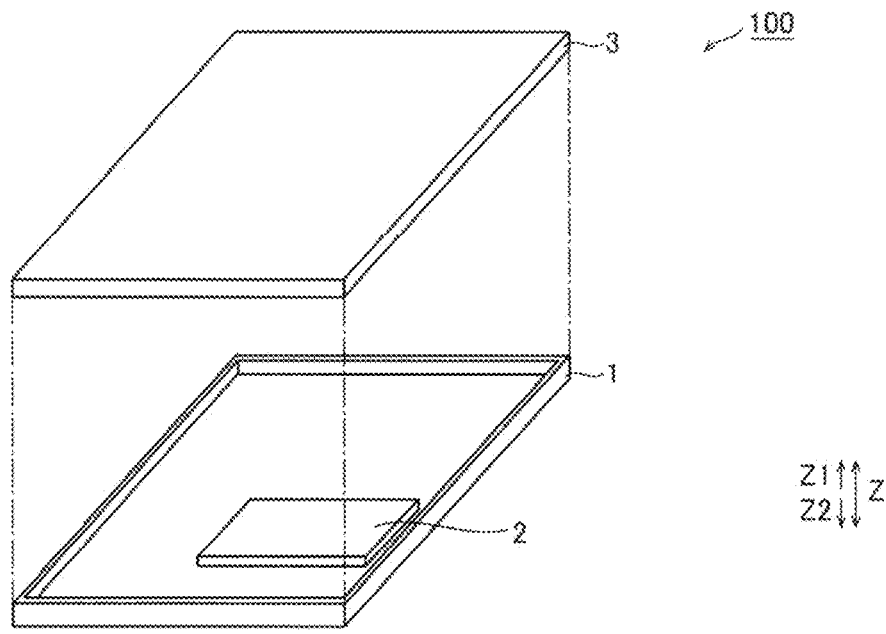
FIG. 1 A schematic perspective view showing an electronic device according to a first embodiment of the present invention.

The structure of an electronic device 100 according to a first embodiment of the present invention is now described with reference to FIGS. 1 and 2.

The electronic device 100 according to the first embodiment of the present invention is a portable electronic device, for example. This electronic device 100 includes a box-shaped housing 1 used as a structural member of the electronic device 100, a substrate 2 arranged on the housing 1, and a display 3 that is connected to the substrate 2 and displays an image etc. The housing 1 is an example of an "electronic device housing" in the claims.

(Structure of Clad Material)

Figure 2:
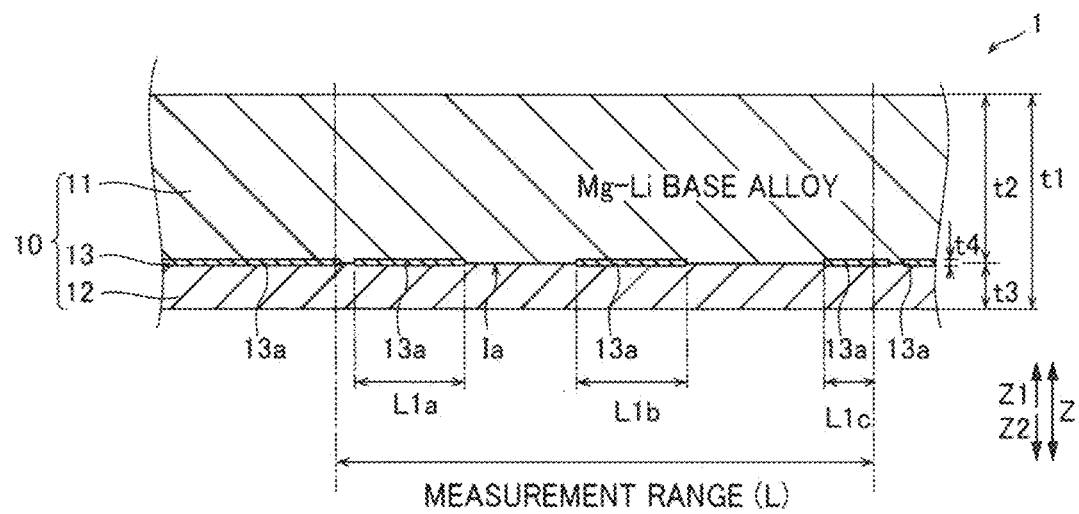
FIG. 2 A sectional view of a clad material according to the first embodiment of the present invention.

The housing 1 is made of a clad material 10, as shown in FIG. 2. Specifically, the housing 1 is made of the clad material 10 including a Mg—Li layer 11, an Al layer 12, and a bonding portion 13. In the clad material 10, the Mg—Li layer 11 and the Al layer 12 are bonded to each other in a state where the same are stacked in this order from a Z1 side to a Z2 side. Furthermore, the bonding portion 13 is arranged on a bonding interface Ia between the Mg—Li layer 11 and the Al layer 12 in a section view when the clad material 10 is cut in a thickness direction (direction Z). The Mg—Li layer 11, the Al layer 12, and the bonding portion 13 are examples of a "first layer", a "second layer", and a "first bonding portion" in the claims, respectively.

The Mg—Li layer 11 is made of a Mg—Li base alloy. The Mg—Li base alloy includes a Mg—Li alloy that contains 14 mass % of Li, the balance Mg, and inevitable impurity elements, LZ91 (a Mg—Li—Zn alloy that contains 9 mass % of Li, 1 mass % of Zn, the balance Mg, and inevitable impurity elements), LA141 (a Mg—Li—Al alloy that contains 14 mass % of Li, 1 mass % of Al, the balance Mg, and inevitable impurity elements), etc. Here, the Mg—Li base alloy preferably contains about 6 mass % or more and about 15 mass % or less of Li. The specific gravity of LZ91 as an example of the Mg—Li base alloy is about 1.5.

The Al layer 12 located on a surface layer of the clad material 10 is made of an Al base alloy more excellent in corrosion resistance than the Mg—Li base alloy and easily surface-treated by alumite treatment or the like. The Al base alloy contains pure Al and an Al alloy. The pure Al includes A1050 that contains 99.5 mass % or more of Al and other elements, A1080 that contains 99.8 mass % or more of Al and other elements, etc. The Al alloy includes an Al—Si alloy in No. A4000s such as Al-2Si (an Al—Si alloy that contains 2 mass % of Si, the balance Al, and inevitable impurity elements), an Al—Mg alloy in No. A5000s, etc. As the Al base alloy of which the Al layer 12 is made, pure Al having a high ductility is preferably used. The specific gravity of the Al base alloy of which the Al layer 12 is made is larger than the specific gravity of the Mg—Li base alloy of which the Mg—Li layer 11 is made. The specific gravity of A1080 as an example of the Al base alloy is about 2.7.

The bonding portion 13 is made of a Cu base alloy. The Cu base alloy contains pure Cu and a Cu alloy. The pure Cu includes C1020 (oxygen-free copper), C1100 (tough pitch copper), C1201 (phosphorous-deoxidized copper), C1220 (phosphorous-deoxidized copper), etc. The Cu alloy includes a Cu—Ni alloy etc.

The specific gravity of the Cu base alloy of which the bonding portion 13 is made is larger than the specific gravity of the Mg—Li base alloy of which the Mg—Li layer 11 is made and the specific gravity of the Al base alloy of which the Al layer 12 is made. The specific gravity of C1020 as an example of the Cu base alloy is about 8.9.

In the clad material 10, the layers in contact with each other are tightly bonded to each other by atomic diffusion, compound formation, or the like. Specifically, in the clad material 10, on the bonding interface Ia between the Mg—Li layer 11 and the Al layer 12, not only the Al layer 12 and the bonding portion 13 are tightly bonded to each other but also the Mg—Li layer 11 and the bonding portion 13 are tightly bonded to each other such that the Mg—Li layer 11 and the Al layer 12 are bonded to each other.

According to the first embodiment, the specific gravity of the clad material 10 is 2.10 or less, which is much smaller than the specific gravity (about 2.7) of a plate material of A1080, which is Al commonly widely used. For a reduction in weight, the specific gravity of the clad material 10 is preferably about 2.00 or less and more preferably about 1.90 or less.

At this time, in the clad material 10, the thickness percentage (($t2/t1$)×100(%)) of the Mg—Li layer 11 is preferably increased to about 60% or more of the thickness $t1$ of the clad material 10 when the thickness of the Mg—Li layer 11 having a small specific gravity is $t2$. The thickness percentage of the Mg—Li layer 11 is more preferably set to about 90% or less of the thickness $t1$ of the clad material 10.

According to the first embodiment, the bonding portion 13 is arranged in an island shape on the bonding interface Ia. In other words, the bonding portion 13 is not layered on the bonding interface Ia but includes a plurality of island-shaped portions 13a. Thus, the percentage of the Cu base alloy of which the bonding portion 13 is made can be reduced as compared with the case where the bonding portion 13 is layered. The island-shaped portions 13a are more preferably arranged dispersedly over the entire bonding interface Ia than arranged intensively on some region of the bonding interface Ia.

The bonding portion 13 is preferably arranged on about 10% or more and about 90% or less of the bonding interface Ia in the section view (the abundance is preferably about 10% or more and about 90% or less in the section view).

At this time, the abundance of the bonding portion 13 is calculated as described below. In other words, as shown in FIG. 2, when the clad material 10 is cut in the thickness direction (direction Z), the total length of the island-shaped portions 13a of the bonding portion 13 is acquired in a measurement range of a certain length L (L=1000 μm, for example) in a direction along the bonding interface Ia between the Mg—Li layer 11 and the Al layer 12 on a predetermined cross-section. Then, the acquired total length is divided by L such that the abundance of the bonding portion 13 is calculated. In the case shown in FIG. 2, for example, the abundance (%) of the bonding portion 13 is calculated by ((L1a+L1b+L1c)/L)×100. The bonding portion 13 is more preferably arranged on about 20% or more and about 80% or less of the bonding interface Ia in the section view. The above measurement is performed at a plurality of different measurement positions (3 measurement positions or more and 10 measurement positions or less, for example) of the bonding portion 13, and the mean is set as the abundance (%) of the bonding portion 13.

When the clad material 10 is debonded on the bonding interface Ia, the bonding portion 13 is preferably arranged on about 4% or more and about 70% or less of a surface (debonded surface) of the debonded Al layer 12 closer to the bonding interface Ia.

Furthermore, when the clad material 10 is debonded on the bonding interface Ia, the peel strength between the Mg—Li layer 11 and the bonding portion 13 is preferably about 1.0 N/mm or more. On the bonding interface Ia, the peel strength between the Mg—Li layer 11 and the bonding portion 13 is more preferably about 1.7 N/mm or more and still more preferably about 3.5 N/mm or more.

In the clad material 10, the thickness $t2$ of the Mg—Li layer 11 is preferably more than each of the thickness $t3$ of the Al layer 12 and the thickness $t4$ of the bonding portion 13. The thickness $t2$ is preferably about 60% or more of the thickness $t1$ of the clad material 10. The thickness $t2$ is more preferably about 75% or more of the thickness $t1$ and still more preferably about 90% or less of the thickness $t1$.

The thickness $t4$ of the bonding portion 13 made of the Cu base alloy having a large specific gravity is preferably not more than the thickness $t2$ of the Mg—Li layer 11 and not more than the thickness $t3$ of the Al layer 12. In order to reduce the specific gravity of the entire clad material 10, the thickness $t4$ is preferably about 6 μm or less. Furthermore, the thickness $t4$ is preferably about 0.5 μm or more.

[Method for Manufacturing Clad Material]

A method for manufacturing the clad material 10 according to the first embodiment of the present invention is now described with reference to FIGS. 1 to 3.

Figure 3:
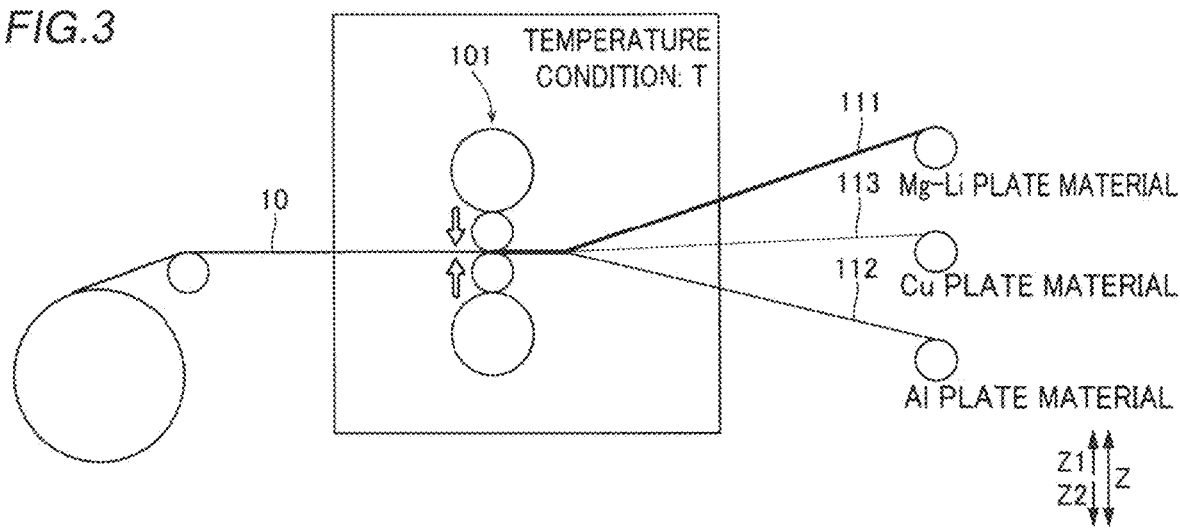
FIG. 3 A schematic diagram for illustrating a method for manufacturing the clad material according to the first embodiment of the present invention.

First, a Mg—Li plate material 111 made of a Mg—Li base alloy, an Al plate material 112 made of an Al base alloy, and a Cu plate material 113 made of a Cu base alloy are prepared, as shown in FIG. 3. The Mg—Li plate material 111, the Al plate material 112, and the Cu plate material 113 are annealed materials prepared by annealing for a predetermined time under a predetermined temperature condition.

At this time, the thickness of each of the Mg—Li plate material 111, the Al plate material 112, and the Cu plate material 113 is adjusted such that the specific gravity of the clad material 10 is 2.10 or less after bonding. Then, the Mg—Li plate material 111, the Cu plate material 113, and the Al plate material 112 are continuously stacked in this order. At this time, the respective plate materials are stacked such that an overlay clad material is famed. Then, the three stacked metal plates are continuously hot-rolled by a mill roll 101. A temperature condition T of hot-rolling is preferably about 150° C. or more and about 300° C. or less.

Thus, the clad material 10 in which the Mg—Li layer 11 and the Al layer 12 are stacked in this order and the bonding portion 13 is arranged on the bonding interface Ia between the Mg—Li layer 11 and the Al layer 12 is prepared, as shown in FIG. 2. When the thickness $t4$ of the bonding portion 13 is not more than a certain value, the elongation of the bonding portion 13 during hot-rolling cannot follow the elongation of the Mg—Li layer 11 and the Al layer 12 such that the bonding portion 13 fractures. Thus, the island-shaped portions 13a are famed in the bonding portion 13. Then, the clad material 10 is diffusion-annealed for a predetermined time (about 5 minutes, for example) in a temperature condition of about 100° C. or more and about 300° C. or less. Thus, the clad material 10 used for the structural member (housing 1) of the electronic device 100 (see FIG. 1) is prepared.

Effects of First Embodiment

According to the first embodiment, the following effects can be obtained.

According to the first embodiment, as hereinabove described, the Mg—Li layer 11 made of a Mg alloy is made of the Mg—Li base alloy such that the specific gravity of the Mg—Li layer 11 can be further reduced by the Mg—Li base alloy that contains Li as compared with the case where the layer made of a Mg alloy is made of AZ80. Thus, the specific gravity of the clad material 10 is reduced to 2.10 or less such that an increase in the specific gravity of the clad material 10 can be suppressed. Furthermore, the clad material 10 includes the Al layer 12 such that the corrosion resistance of the clad material 10 can be improved. Consequently, the lightweight clad material 10 having a high corrosion resistance can be obtained. In addition, the Mg—Li base alloy of which the Mg—Li layer 11 is made is easily bonded to the bonding portion 13 made of the Cu base alloy as compared with a Mg alloy that mainly contains Al in addition to Mg. Thus, the bonding strength on the bonding interface Ia is sufficiently ensured such that debonding of the Mg—Li layer 11 and the Al layer 12 from each other can be suppressed. Consequently, the housing 1 (clad material 10) particularly suitable for the portable electronic device 100 particularly requiring reduction in weight can be provided.

According to the first embodiment, as hereinabove described, the bonding portion 13 is arranged in the island shape on the bonding interface Ia. Thus, as compared with the case where the bonding portion 13 is layered on the entire bonding interface Ia, the bonding portion 13 made of the Cu base alloy having a larger specific gravity than the Mg—Li base alloy and the Al base alloy can be reduced.

According to the first embodiment, as hereinabove described, the bonding portion 13 is arranged on about 10% or more (preferably about 20% or more) of the bonding interface Ia in the section view. According to this structure, the bonding strength on the bonding interface Ia can be reliably ensured. Furthermore, the bonding portion 13 is arranged on about 90% or less (more preferably about 80% or less) of the bonding interface Ia in the section view. According to this structure, an excessive increase in the bonding portion 13 made of the Cu base alloy having a larger specific gravity than the Mg—Li base alloy and the Al base alloy can be suppressed, and hence an increase in the specific gravity of the clad material 10 can be suppressed.

According to the first embodiment, as hereinabove described, the thickness t4 of the bonding portion 13 is set to about 0.5 μm or more in the section view such that the bonding portion 13 can be sufficiently ensured, and hence a reduction in the bonding strength on the bonding interface Ia can be suppressed. Furthermore, the thickness t4 is set to about 6 μm or less such that an excessive increase in the bonding portion 13 made of the Cu base alloy having a larger specific gravity than the Mg—Li base alloy and the Al base alloy can be suppressed, and hence an increase in the specific gravity of the clad material 10 can be suppressed.

According to the first embodiment, as hereinabove described, the thickness t2 of the Mg—Li layer 11 is set to about 60% or more of the thickness t1 of the clad material 10 such that the percentage of the Mg—Li base alloy having the smallest specific gravity among the Mg—Li base alloy, the Al base alloy, and the Cu base alloy can be sufficiently increased, and hence the clad material 10 can be effectively reduced in weight. Furthermore, the thickness t2 is set to about 90% or less of the thickness t1 such that insufficient ensuring of the thickness t3 of the Al layer 12 made of the Al base alloy is suppressed, and hence a reduction in the corrosion resistance of the clad material 10 can be suppressed. In addition, insufficient ensuring of the bonding portion 13 is suppressed such that a reduction in the bonding strength on the bonding interface Ia can be suppressed.

According to the first embodiment, as hereinabove described, the peel strength between the Mg—Li layer 11 and the bonding portion 13 is set to about 1.0 N/mm or more such that the bonding strength between the Mg—Li layer 11 and the Al layer 12 through the bonding portion 13 can be reliably ensured.

According to the first embodiment, as hereinabove described, the Mg—Li base alloy of which the Mg—Li layer 11 is made contains about 6 mass % or more of Li such that the content of Li in the Mg—Li base alloy can be sufficiently ensured, and hence the Mg—Li layer 11 can be sufficiently reduced in weight. Furthermore, the Mg—Li base alloy contains about 6 mass % or more of Li such that the ductility of the Mg—Li layer 11 can be improved, and hence the press workability of the clad material 10 can be improved. In addition, the Mg—Li base alloy contains about 15 mass % or less of Li such that an increase in Li, which causes a reduction in corrosion resistance, contained in the Mg—Li base alloy can be suppressed, and hence the stability of the Mg—Li layer 11 can be ensured.

Second Embodiment

A second embodiment of the present invention is now described with reference to FIG. 4. In the second embodiment, the case where a clad material 210 has a five-layered structure is described.

<Structure of Clad Material>

According to the second embodiment, the clad material 210 includes an Al layer 214 and a bonding portion 215 in addition to a Mg—Li layer 211, an Al layer 212, and a bonding portion 213. In the clad material 210, the Al layer 214, the Mg—Li layer 211, and the Al layer 212 are bonded to each other in a state where the same are stacked in this order from a Z1 side to a Z2 side. Furthermore, the bonding portion 213 is arranged on a bonding interface Ia between the Mg—Li layer 211 and the Al layer 212 on the Z2 side in a section view when the clad material 210 is cut in a thickness direction (direction Z). In addition, the bonding portion 215 is arranged on a bonding interface Ib between the Mg—Li layer 211 and the Al layer 214 on the Z1 side in the section view. The Mg—Li layer 211, the Al layers 212 and 214, and the bonding portions 213 and 215 are examples of a "first layer", a "second layer", a "third layer", a "first bonding portion", and a "second bonding portion" in the claims, respectively.

The Mg—Li layer 211 is made of a Mg—Li base alloy. Both of the Al layers 212 and 214 located on surface layers of the clad material 210 are made of Al base alloys. The Al layers 212 and 214 are preferably made of the Al base alloys having substantially the same composition. Furthermore, the thickness t13 of the Al layer 212 and the thickness t15 of the Al layer 214 are preferably substantially the same as each other. Thus, it is not necessary to strictly distinguish the front and back of the clad material 210.

The bonding portions 213 and 215 each are made of a Cu base alloy. In the clad material 210, on the bonding interface Ia between the Mg—Li layer 211 and the Al layer 212, not only the Al layer 212 and the bonding portion 213 are tightly bonded to each other but also the Mg—Li layer 211 and the bonding portion 213 are tightly bonded to each other such that the Mg—Li layer 211 and the Al layer 212 are bonded to each other. Furthermore, on the bonding interface Ib between the Mg—Li layer 211 and the Al layer 214, not only the Al layer 214 and the bonding portion 215 are tightly bonded to each other but also the Mg—Li layer 211 and the bonding portion 215 are tightly bonded to each other such that the Mg—Li layer 211 and the Al layer 214 are bonded to each other.

According to the second embodiment, the specific gravity of the clad material 210 is 2.10 or less, which is much smaller than the specific gravity (about 2.7) of a plate material of A1080, which is Al commonly widely used. For a reduction in weight, the specific gravity of the clad material 210 is preferably about 2.00 or less and more preferably about 1.90 or less.

At this time, in the clad material 210, the thickness percentage (($t12/t11$)×100(%)) of the Mg—Li layer 211 is preferably increased to about 60% or more of the thickness $t11$ of the clad material 210 when the thickness of the Mg—Li layer 211 having a small specific gravity is $t12$. The thickness percentage of the Mg—Li layer 211 is more preferably set to about 90% or less of the thickness $t11$ of the clad material 210.

According to the second embodiment, the bonding portions 213 and 215 are arranged in island shapes on the bonding interfaces Ia and Ib, respectively. In other words, the bonding portions 213 and 215 are not layered on the bonding interfaces Ia and Ib, respectively, but includes a plurality of island-shaped portions 213a and 215a. The bonding portion 213 is preferably arranged on about 10% or more and about 90% or less of the bonding interface Ia in the section view (the abundance is preferably about 10% or more and about 90% or less in the section view). Similarly, the bonding portion 215 is preferably arranged on about 10% or more and about 90% or less of the bonding interface Ib in the section view. In the case shown in FIG. 4, the abundance (%) of the bonding portion 215 is calculated by (($L2a+L2b+L2c+L2d$)/$L$)×100. Measurement is performed at a plurality of different measurement positions of the bonding portions 213 and 215, and the means are set as the abundances (%) of the bonding portions 213 and 215, respectively.

The bonding portion 213 is more preferably arranged on about 20% or more and about 80% or less of the bonding interface Ia in the section view. Similarly, the bonding portion 215 is more preferably arranged on about 20% or more and about 80% or less of the bonding interface Ib in the section view.

When the clad material 210 is debonded on the bonding interface Ia, the bonding portion 213 is preferably arranged on about 4% or more and about 70% or less of a surface (debonded surface) of the debonded Al layer 212 closer to the bonding interface Ia. Similarly, when the clad material 210 is debonded on the bonding interface Ib, the bonding portion 215 is preferably arranged on about 4% or more and about 70% or less of a surface of the debonded Al layer 214 closer to the bonding interface Ib.

Furthermore, when the clad material 210 is debonded on the bonding interface Ia, the peel strength between the Mg—Li layer 211 and the bonding portion 213 is preferably about 1.0 N/mm or more. Similarly, when the clad material 210 is debonded on the bonding interface Ib, the peel strength between the Mg—Li layer 211 and the bonding portion 215 is preferably about 1.0 N/mm or more. On each of the bonding interfaces Ia and Ib, the peel strength between the Mg—Li layer 211 and the bonding portion 213 (215) is more preferably about 1.7 N/mm or more and still more preferably about 3.5 N/mm or more.

In the clad material 210, the thickness $t12$ of the Mg—Li layer 211 is preferably more than each of the thickness $t13$ of the Al layer 212, the thickness $t14$ of the bonding portion 213, the thickness $t15$ of the Al layer 214, and the thickness $t16$ of the bonding portion 215. The thickness $t12$ is preferably about 60% or more of the thickness $t11$ of the clad material 210. The thickness $t12$ is more preferably about 75% or more of the thickness $t11$ and still more preferably about 90% or less of the thickness $t11$.

Both the thickness $t14$ of the bonding portion 213 and the thickness $t16$ of the bonding portion 215 made of the Cu base alloys having large specific gravities are preferably not more than the thickness $t12$ of the Mg—Li layer 211, not more than the thickness $t13$ of the Al layer 212, and not more than the thickness $t15$ of the Al layer 214. In order to reduce the specific gravity of the entire clad material 210, both the thicknesses $t14$ and $t16$ are preferably about 6 μm or less. Furthermore, both the thicknesses $t14$ and $t16$ are preferably about 0.5 μm or more.

The remaining structures of the clad material 210 according to the second embodiment are similar to those of the clad material 10 according to the aforementioned first embodiment. A method for manufacturing the clad material 210 according to the second embodiment is similar to the method for manufacturing the clad material 10 according to the aforementioned first embodiment except that an Al plate material, a Cu plate material, a Mg—Li plate material, a Cu plate material, and an Al plate material are stacked in this order.

[Effects of Second Embodiment]

According to the second embodiment, the following effects can be obtained.

According to the second embodiment, as hereinabove described, the Mg—Li layer 211 made of a Mg alloy is made of the Mg—Li base alloy, and the clad material 210 includes the Al layers 212 and 214. Thus, the lightweight clad material 210 having a high corrosion resistance can be obtained. Furthermore, by the bonding portions 213 and 215, the bonding strength on the bonding interface Ia is sufficiently ensured such that debonding of the Mg—Li layer 211 and the Al layer 212 from each other can be suppressed, and the bonding strength on the bonding interface Ib is sufficiently ensured such that debonding of the Mg—Li layer 211 and the Al layer 214 from each other can be suppressed.

According to the second embodiment, as hereinabove described, the bonding portions 213 and 215 are arranged in the island shapes on the bonding interfaces Ia and Ib, respectively. Thus, the specific gravity of the clad material 210 is reduced to 2.10 or less such that the clad material 210 can be more reliably reduced in weight.

According to the second embodiment, as hereinabove described, the bonding portion 213 is arranged on about 10% or more (preferably about 20% or more) of the bonding interface Ia in the section view. Similarly, the bonding portion 215 is arranged on about 10% or more (preferably about 20% or more) of the bonding interface Ib in the section view. According to this structure, the bonding strengths on the bonding interfaces Ia and Ib can be reliably ensured. Furthermore, the bonding portion 213 is arranged on about 90% or less (more preferably about 80% or less) of the bonding interface Ia in the section view. Similarly, the bonding portion 215 is arranged on about 90% or less (more preferably about 80% or less) of the bonding interface Ib in the section view. According to this structure, an increase in the specific gravity of the clad material 210 can be suppressed.

According to the second embodiment, as hereinabove described, the thickness t14 of the bonding portion 213 and the thickness t16 of the bonding portion 215 are set to about 0.5 µm or more in the section view such that reductions in the bonding strengths on the bonding interfaces Ia and Ib can be suppressed. Furthermore, the thicknesses t14 and t16 are set to about 6 µm or less such that an increase in the specific gravity of the clad material 210 can be suppressed.

According to the second embodiment, as hereinabove described, the peel strength between the Mg—Li layer 211 and the bonding portion 213 is set to about 1.0 N/mm or more, and the peel strength between the Mg—Li layer 211 and the bonding portion 215 is set to about 1.0 N/mm or more. Thus, the bonding strength between the Mg—Li layer 211 and the Al layer 212 through the bonding portion 213 can be reliably ensured, and the bonding strength between the Mg—Li layer 211 and the Al layer 214 through the bonding portion 215 can be reliably ensured.

According to the second embodiment, as hereinabove described, the clad material 210 includes the Al layer 214 bonded to a surface of the Mg—Li layer 211 opposite (Z1 side) to the Al layer 212 and made of the Al base alloy and the bonding portion 215 arranged on the bonding interface Ib between the Mg—Li layer 211 and the Al layer 214 in the section view and made of the Cu base alloy. Thus, the Mg—Li layer 211 having a low corrosion resistance is sandwiched by the Al layer 212 and the Al layer 214 made of the Al base alloys, and hence the corrosion resistance of the clad material 210 can be effectively improved. Furthermore, the clad material 210 has a layered structure symmetrical about the Mg—Li layer 211, in which the Al layer 212 made of the Al base alloy, the Mg—Li layer 211 made of the Mg—Li base alloy, and the Al layer 214 made of the Al base alloy are stacked in this order, such that warpage in the clad material 210 can be effectively suppressed. Thus, the clad material 210 suitable for a housing 1 requiring flatness can be provided. The remaining effects are similar to those of the aforementioned first embodiment.

EXAMPLES

An experiment and a simulation conducted in order to confirm the effect of the present invention are now described with reference to FIGS. 3 to 20. As the experiment, measurement of the abundance of the bonding portion and measurement of the peel strength were performed. As the simulation, the specific gravity of the clad material with respect to the thickness percentage of the Mg—Li layer in the case where the thickness of the clad material and the thickness of the bonding portion were set to predetermined values was obtained.

<Preparation of Clad Materials According to Examples>

First, the clad material 210 according to Example 1 that corresponds to the aforementioned second embodiment was prepared. Specifically, first, a Mg—Li plate material made of LZ91 (Mg—Li—Zn alloy), a pair of Al plate materials made of A1080 (pure Al), and a pair of Cu plate materials made of C1020 (pure Cu) were prepared. The specific gravity of LZ91 is 1.50, the specific gravity of A1080 is 2.70, and the specific gravity of C1020 is 8.94.

Then, the Al plate material, the Cu plate material, the Mg—Li plate material, the Cu plate material, and the Al plate material were continuously stacked in this order. Then, the stacked metal plates in FIG. 4 were continuously hot-rolled by a mill roll (see FIG. 3) in the temperature condition described in the aforementioned first embodiment, and were diffusion-annealed in the temperature condition described in the aforementioned first embodiment. Thus, the clad material 210 according to Example 1 shown in FIG. 4, in which the Al layer 214, the Mg—Li layer 211, and the Al layer 212 were stacked in this order, and the bonding portions 213 and 215 were arranged on the bonding interface Ia between the Mg—Li layer 211 and the Al layer 212 and the bonding interface Ib between the Mg—Li layer 211 and the Al layer 214, respectively, was prepared.

According to Example 1, when the thickness t11 of the clad material 210 was set to 480 µm, the thickness of each of the Mg—Li plate material, the pair of Al plate materials, and the pair of Cu plate materials was adjusted such that the thickness t12 of the Mg—Li layer 211 was 318 µm, both the thickness t13 of the Al layer 212 and the thickness t15 of the Al layer 214 were 80 µm, and both the thickness t14 of the bonding portion 213 and the thickness t16 of the bonding portion 215 were 1 µm. Consequently, the specific gravity of the clad material 210 according to Example 1 was 1.93.

Furthermore, the clad material 210 according to Example 2 was prepared. According to Example 2, the clad material 210 was prepared similarly to the clad material 210 according to Example 1 except that the thickness t12 was set to 317 µm and both the thicknesses t14 and t16 were set to 1.5 µm. The specific gravity of the clad material 210 according to Example 3 was 1.95.

Furthermore, the clad material 210 according to Example 3 was prepared. According to Example 3, the clad material 210 was prepared similarly to the clad material 210 according to Example 1 except that the thickness t12 was set to 314 µm and both the thicknesses t14 and t16 were set to 3 µm. The specific gravity of the clad material 210 according to Example 3 was 1.99.

Furthermore, the clad material 210 according to Example 4 was prepared. According to Example 4, the clad material 210 was prepared similarly to the clad material 210 according to Example 1 except that the thickness t12 was set to 308 µm and both the thicknesses t14 and t16 were set to 6 µm. The specific gravity of the clad material 210 according to Example 3 was 2.09.

On the other hand, a clad material according to Comparative Example 1 was prepared. According to Comparative Example 1, the clad material was prepared similarly to the clad material 210 according to Example 1 except that the thickness of a Mg—Li layer was set to 320 µm and no pair of bonding portions was provided. The specific gravity of the clad material according to Comparative Example 1 was 1.90.

Furthermore, a clad material according to Comparative Example 2 was prepared. According to Comparative Example 2, the clad material was prepared similarly to the clad material 210 according to Example 1 except that the thickness of a Mg—Li layer was set to 296 µm and the thickness of each of a pair of bonding portions was set to 12 µm. Furthermore, a clad material according to Comparative Example 3 was prepared. According to Comparative Example 3, the clad material was prepared similarly to the clad material 210 according to Example 1 except that the thickness of a Mg—Li layer was set to 272 µm and the thickness of each of a pair of bonding portions was set to 24 µm. The specific gravities of the clad materials according to Comparative Examples 2 and 3 were 2.27 and 2.64, respectively, and both exceeded the upper limit (2.10) of the specific gravity of the clad material according to the present invention.

Furthermore, a clad material according to Comparative Example 4 was prepared. According to Comparative Example 4, a Mg layer made of AZ31 that contains 3 mass % of Al, 1% of Zn, the balance Mg, and inevitable impurity elements was used instead of the Mg—Li layer 211 made of LZ91 according to Example 1, and A1050 was used instead of A1080 of which the Al layers 212 and 214 according to Example 1 were made. In other words, according to Comparative Example 4, no Mg alloy that contains Li was used. According to Comparative Example 4, the thickness of the Mg layer was set to 320 μm, the thickness of each of a pair of Al layers was set to 80 μm, and the thickness of each of a pair of bonding portions was set to 20 μm. Except for those, the clad material was prepared similarly to the clad material 210 according to Example 1. The specific gravity of the clad material according to Comparative Example 4 was 2.61.

The thickness percentages and the specific gravities of the clad materials according to Examples 1 to 4 and Comparative Examples 1 to 4 described above are shown in Table 1.

(Measurement Result of Abundance of Bonding Portion in Section View)

FIGS. 5 to 10 show the sectional photographs of the clad materials according to Examples 1 to 4 and Comparative Examples 1 and 2. In the clad materials according to Examples 1 to 4 and Comparative Example 2, the bonding portions made of pure Cu were on the bonding interfaces between the Al layers and the Mg—Li layers. In the photographs in FIGS. 6 to 10, portions surrounded by white lines correspond to the bonding portions.

Figure 10:
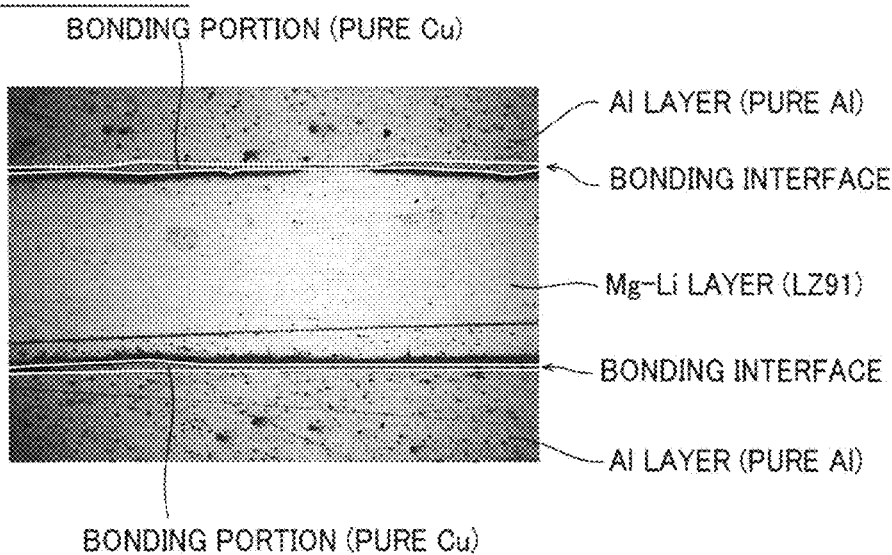
FIG. 10 A sectional photograph of Comparative Example 2 in the cross-section observation conducted in order to confirm the effect of the present invention.

In the clad materials according to Examples 1 to 4, no bonding portions were on portions of the bonding interfaces between the Al layers and the Mg—Li layers, as shown in FIGS. 6 to 9, respectively, and hence the bonding portions (island-shaped portions) were island-shaped on the bonding interfaces. Furthermore, it has been confirmable that in the clad materials according to Examples 1 to 4, the island-shaped portions of the bonding portions are dispersed over the entire bonding interfaces. On the other hand, in the clad material according to Comparative Example 2, the bonding portions were layered on the entire bonding interfaces between the Al layers and the Mg—Li layer, as shown in FIG. 10. In other words, in the clad material according to

TABLE 1

| | THICKNESS AFTER ROLLING (μm) | | | | | ABUNDANCE (%) OF BONDING PORTION | | | PEEL |
|---|---|---|---|---|---|---|---|---|---|
| | Al LAYER | BONDING PORTION | Mg LAYER | BONDING PORTION | Al LAYER | SECTION VIEW | DEBONDED SURFACE | SPECIFIC GRAVITY | STRENGTH (N/mm) |
| COMPARATIVE EXAMPLE 1 | 80 | 0 | 320 | 0 | 80 | 0.0 | 0.0 | 1.90 | 0.916 |
| EXAMPLE 1 | 80 | 1 | 318 | 1 | 80 | 17.3 | 4.5 | 1.93 | 1.217 |
| EXAMPLE 2 | 80 | 1.5 | 317 | 1.5 | 80 | 24.1 | 10.2 | 1.95 | 1.741 |
| EXAMPLE 3 | 80 | 3 | 314 | 3 | 80 | 50.6 | 39.5 | 1.99 | 3.692 |
| EXAMPLE 4 | 80 | 6 | 308 | 6 | 80 | 79.4 | 69.2 | 2.09 | 5 OR MORE |
| COMPARATIVE EXAMPLE 2 | 80 | 12 | 296 | 12 | 80 | 100.0 | 100.0 | 2.27 | 5 OR MORE |
| COMPARATIVE EXAMPLE 3 | 80 | 24 | 272 | 24 | 80 | — | DEBONDING IS IMPOSSIBLE | 2.64 | 5 OR MORE |
| COMPARATIVE EXAMPLE 4 | 80 | 20 | 320 | 20 | 80 | — | — | 2.61 | 1.5 |

Al LAYER: A1080, Mg LAYER: LZ91, BONDING PORTION: C1020 (OTHER THAN COMPARATIVE EXAMPLE 4)
Al LAYER: A1050, Mg LAYER: AZ31, BONDING PORTION: C1020 (COMPARATIVE EXAMPLE 4)

<Measurement of Abundance of Bonding Portion in Section View>

The clad materials according Examples 1 to 4 and Comparative Examples 1 and 2 each were cut in a thickness direction, and the sectional photographs of the clad materials were taken. Then, the abundances (%) of the bonding portions on bonding interfaces in section views were calculated from the sectional photographs. At this time, as to the clad materials according to Examples 1 to 4 and Comparative Examples 1 and 2, the total lengths of island-shaped portions of the bonding portions in the case where the lengths L (see FIG. 4) of measurement ranges in directions along the bonding interfaces were set to 1000 μm were acquired. Then, the total lengths were divided by 1000 and were multiplied by 100 such that the abundances (%) of the bonding portions in the predetermined measurement range were calculated. Furthermore, in each of Examples 1 to 4 and Comparative Examples 1 and 2, measurement was performed in four different measurement ranges, and the mean was set as the abundance (%) of the bonding portion in the clad material.

Comparative Example 2, the bonding portions were not island-shaped. This is conceivably because in the clad material according to Comparative Example 2, the bonding portions each were formed with a sufficiently large thickness of 12 μm. Bonding portions each having a certain degree of thickness such as those according to Example 4 can be conceivably layered not island-shaped by adjusting a material for the bonding portions or the conditions of hot-rolling, for example.

In the section view, the abundances of the bonding portion in the predetermined four measurement ranges of Example 1 were 18.2%, 15.1%, 18.6%, and 17.2%, respectively. Thus, the abundance of the bonding portion in the clad material according to Example 1 was 17.3% on average. In the section view, the abundances of the bonding portion in the predetermined four measurement ranges of Example 2 were 21.7%, 27.4%, 19.0%, and 28.4%, respectively. Thus, the abundance of the bonding portion in the clad material according to Example 2 was 24.1% on average.

In the section view, the abundances of the bonding portion in the predetermined four measurement ranges of Example 3 were 59.7%, 54.7%, 53.4%, and 34.6%, respectively. Thus, the abundance of the bonding portion in the clad material according to Example 3 was 50.6% on average. In the section view, the abundances of the bonding portion in the predetermined four measurement ranges of Example 4 were 92.6%, 70.7%, 87.3%, and 67.5%, respectively. Thus, the abundance of the bonding portion in the clad material according to Example 4 was 79.4% on average.

<Debonding Test>

Figure 11:
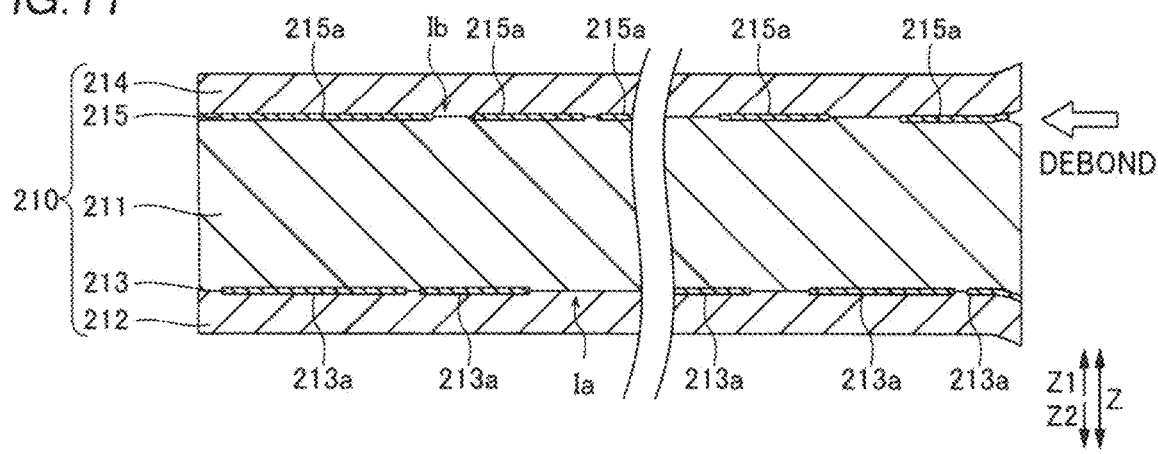
FIG. 11 A diagram for illustrating a debonding test conducted in order to confirm the effect of the present invention.

Next, a debonding test was performed on the clad materials according to Examples 1 to 4 and Comparative Examples 1 to 4. In this debonding test, the bonding interface on an edge of the clad material 210 was first forcibly debonded by an unshown tool such as nippers, as shown in FIG. 11. A clad material having a high bonding strength and not easily forcibly debonded was bonded in advance at the time of hot-rolling such that its edge was easily debonded.

Figure 12:
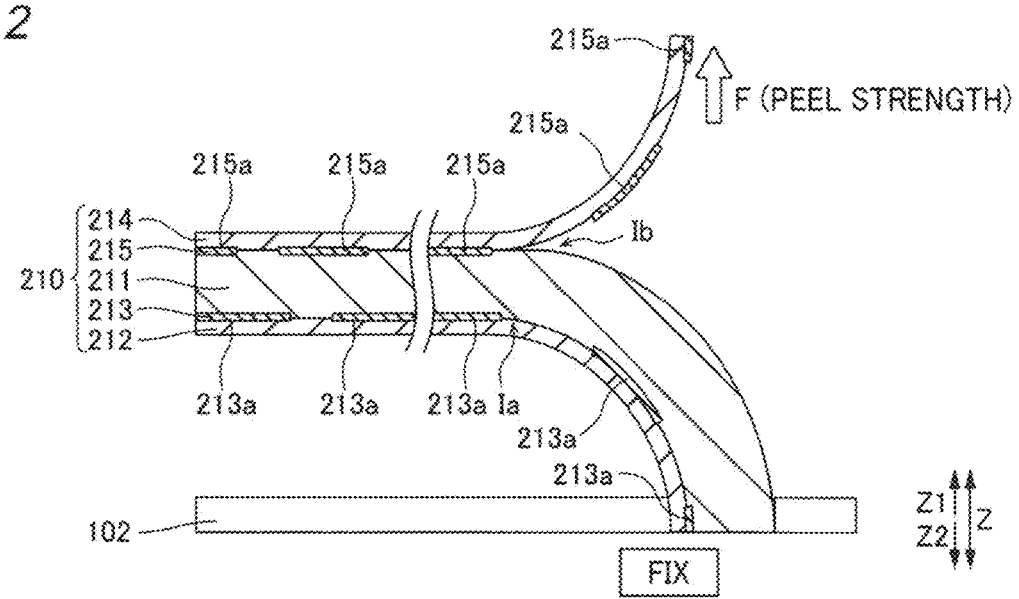
FIG. 12 A diagram for illustrating the debonding test conducted in order to confirm the effect of the present invention.
Figure 16:
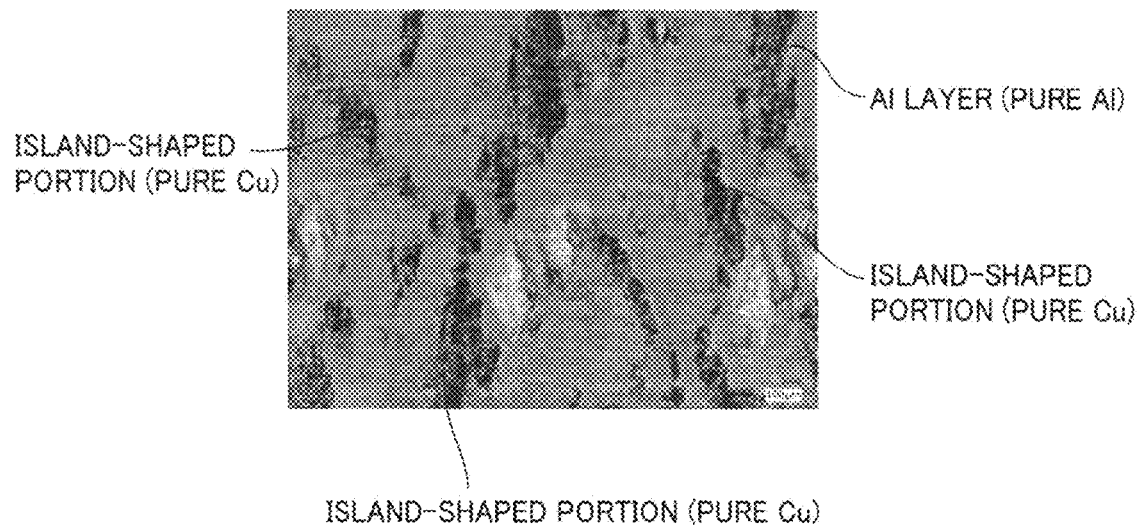
FIG. 16 A photograph of a debonded surface according to Example 3 in the debonding test conducted in order to confirm the effect of the present invention.
Figure 17:
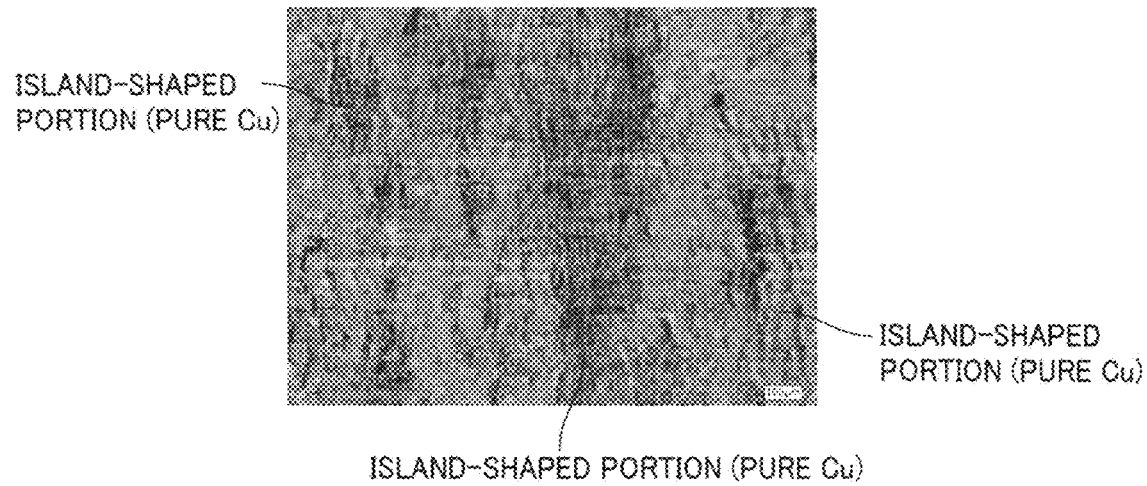
FIG. 17 A photograph of a debonded surface according to Example 4 in the debonding test conducted in order to confirm the effect of the present invention.

Then, the debonding test shown in FIG. 12 was performed on the clad material 210. Specifically, the bonding interface was further debonded by fixing one side (the Mg—Li layer 211, the Al layer 212, and the bonding portion 213 shown in FIG. 12) of the debonded interface (the bonding interface Ib shown in FIG. 12, for example) to a fixing member 102 and pulling the other side (the Al layer 214 and the bonding portion 215 shown in FIG. 12) of the debonded interface in a direction Z1. Then, the load required during debonding was divided by the width of the clad material 210 (the width of the clad material 210 in a vertical direction in the plane of paper) such that the peel strength (bonding strength) F between the Mg—Li layer 211 and the bonding portion 215 was obtained as the load per unit width. The bonding strength between the Al layer and the bonding portion was larger than the bonding strength between the Mg—Li layer and the bonding portion, and hence the peel strength between the Mg—Li layer and the bonding portion was measured. The peel strength between the Mg—Li layer 211 and the bonding portion 213 conceivably obtains substantially the same result as the peel strength between the Mg—Li layer 211 and the bonding portion 215.

The peel strength was measured as the mean of the load in a length range from 5 mm to 10 mm. The peel strength was measured at five positions, and the mean was set as the peel strength of the clad material according to each of Examples 1 to 4 and Comparative Examples 1 to 4.

(Result of Debonding Test)

As the results of the debonding test shown in Table 1 described above and FIG. 13, in Comparative Example 1 in which no bonding portion made of pure Cu was provided on the bonding interface between the Al layer and the Mg—Li layer, the peel strength became less than 1.0 N/mm, but in Examples 1 to 4 and Comparative Examples 2 to 4 in which the bonding portions made of pure Cu were provided on the bonding interfaces, the peel strength became 1.2 N/mm or more (1.0 N/mm or more). Thus, it has been confirmable that the bonding strength can be reliably improved by providing the bonding portions made of pure Cu on the bonding interfaces. Particularly in Example 1, it has been proved that the peel strength is 1.217 N/mm and the bonding strength is sufficiently obtained although the specific gravity is 1.93, which is very small.

It has been confirmable that even when the abundance of the bonding portion in the section view is 79.4% and the bonding portion is not on the entire bonding interface as in Example 4, the peel strength is 5 N/mm or more and a very large bonding strength is generated.

On the other hand, in Comparative Example 3, peeling off was impossible (debonding was impossible). As shown in Comparative Example 4, even when the bonding portion had a sufficient thickness of 20 μm, the peel strength became 1.5 N/mm, which was small, in the case where instead of the Mg—Li base alloy, a Mg—Al base alloy that contains no Li was used for a Mg layer. This peel strength is smaller than the peel strength (1.741 N/mm) in Example 2 in which the bonding portion has only a small thickness of 1.5 μm. Thus, it has been confirmable that the Mg—Li base alloy is more excellent in adhesion to the bonding portion made of the Cu base alloy than a Mg alloy containing no Li, such as AZ31.

<Observation of Debonded Surface>

Surfaces (debonded surfaces) of the clad materials closer to the Al layers according to Examples 1 to 4 debonded in the debonding test were observed. FIGS. 14 to 17 show the photographs of the debonded surfaces of the clad materials according to Examples 1 to 4, respectively. It has been confirmable that the bonding portions (island-shaped portions) are dispersed over the entire bonding interfaces (debonded surfaces) on the debonded surfaces of the clad materials according to Examples 1 to 4.

<Measurement of Abundance of Bonding Portion on Debonded Surface>

From the planar photographs of the clad materials according to Examples 1 to 4, the abundances of the bonding portions on the debonded surfaces were measured.

(Measurement Result of Abundance of Bonding Portion on Debonded Surface)

As shown in Table 1 described above and FIG. 13, the abundances of the bonding portions on the debonded surfaces became smaller than the abundances of the bonding portions in the section views in Examples 1 to 4. This is conceivably because the bonding portions (island-shaped portions) were dropped off or remained on the Mg—Li layer side in the debonding test.

<Simulation>

Figure 4:
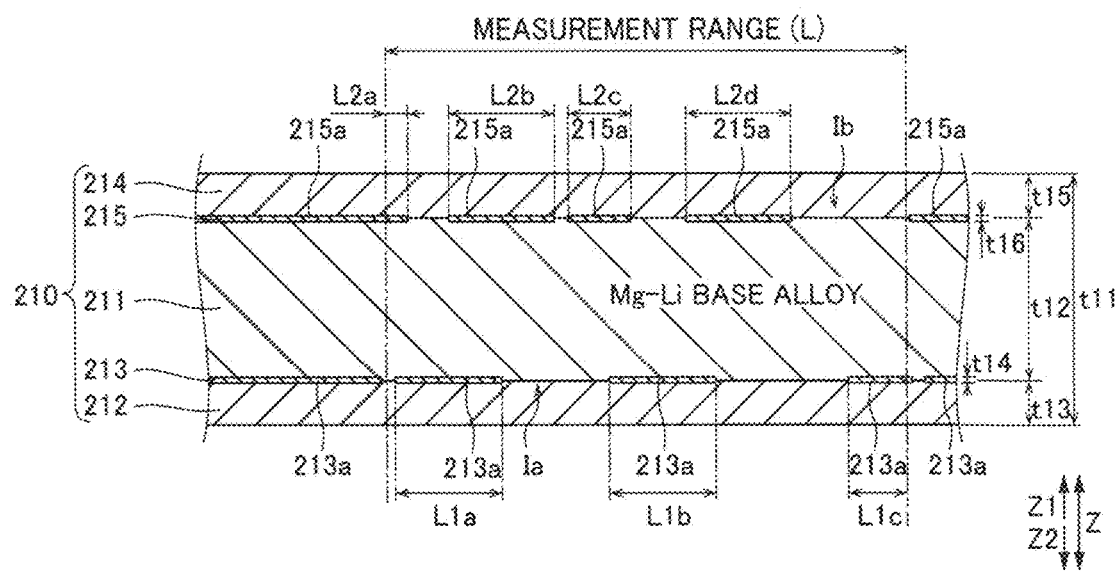
FIG. 4 A sectional view of a clad material according to a second embodiment of the present invention.
Figure 5:
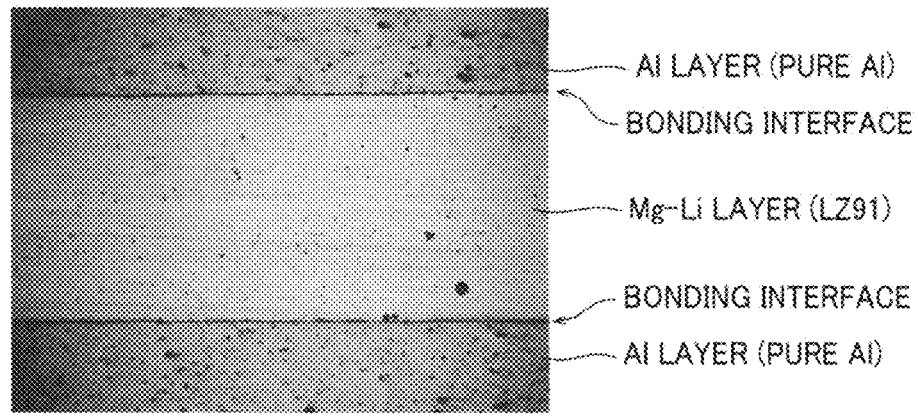
FIG. 5 A sectional photograph of Comparative Example 1 in cross-section observation conducted in order to confirm the effect of the present invention.
Figure 6:
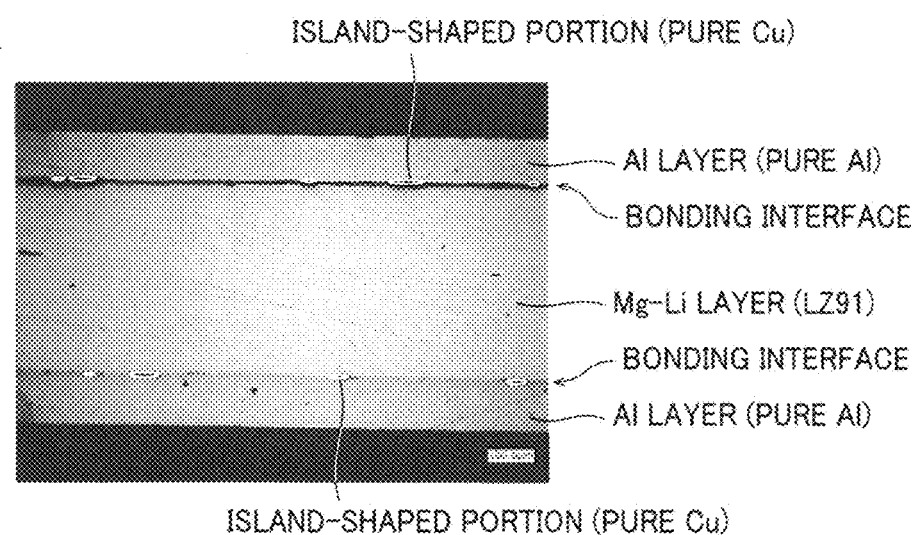
FIG. 6 A sectional photograph of Example 1 in the cross-section observation conducted in order to confirm the effect of the present invention.
Figure 9:
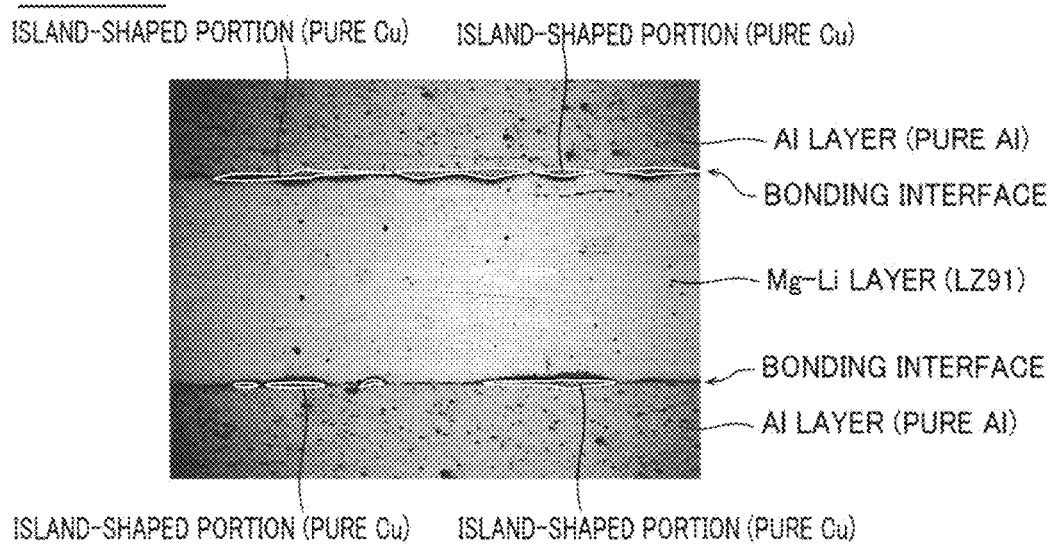
FIG. 9 A sectional photograph of Example 4 in the cross-section observation conducted in order to confirm the effect of the present invention.

In the simulation, the clad material 210 shown in FIG. 4, in which the Al layer 214 made of A1080, the Mg—Li layer 211 made of LZ91, and the Al layer 212 made of A1080 were stacked in this order and the bonding portions 213 and 215 both made of C1020 were arranged on the bonding interface Ia between the Mg—Li layer 211 and the Al layer 212 and the bonding interface Ib between the Mg—Li layer 211 and the Al layer 214, respectively, was assumed. The specific gravity of the assumed clad material 210 with respect to the thickness percentage of the Mg—Li layer 211 was obtained.

At this time, the specific gravity of the clad material 210 with respect to the thickness percentage of the Mg—Li layer 211 in the cases where the thickness t11 of the clad material 210 was set to 0.6 mm and both the thickness t14 of the bonding portion 213 and the thickness t16 of the bonding portion 215 were set to 1 μm, 5 μm, and 10 μm was obtained. The thickness percentage of each of the bonding portions 213 and 215 in these cases is 0.017 (=(1/600)×100)%, 0.83 (=(5/600)×100)%, and 1.67 (=(10/600)×100)%, respectively.

Furthermore, the specific gravity of the clad material 210 with respect to the thickness percentage of the Mg—Li layer 211 in the cases where the thickness t11 of the clad material 210 was set to 0.4 mm and both the thickness t14 of the bonding portion 213 and the thickness t16 of the bonding portion 215 were set to 1 μm, 5 μm, and 10 μm was obtained. The thickness percentage of each of the bonding portions 213 and 215 in these cases is 0.025 (=(1/400)×100)%, 1.25 (=(5/400)×100)%, and 2.50 (=(10/400)×100)%, respectively. Both the thickness percentages (%) of the Al layers 212 and 214 are (100−(the thickness percentage of the Mg—Li layer 211+the thickness percentage of the bonding portion 213+the thickness percentage of the bonding portion 215))/2.

(Result of Simulation)

Figure 18:
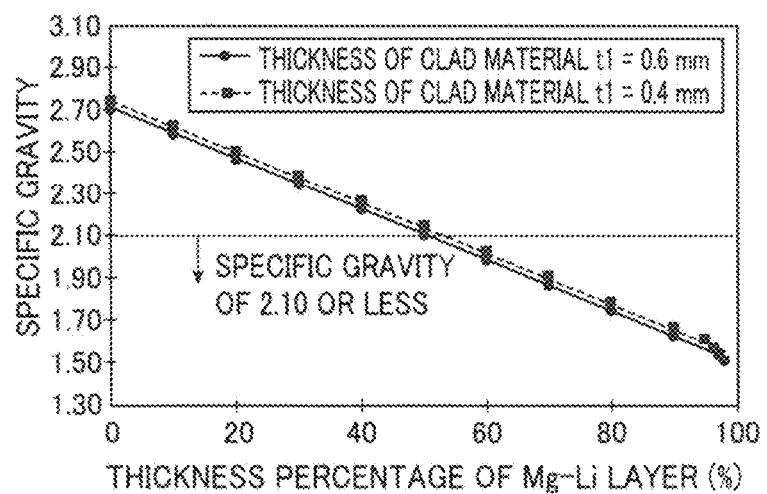
FIG. 18 A graph showing the specific gravity of a clad material with respect to the thickness percentage of a Mg—Li layer in a simulation conducted in order to confirm the effect of the present invention.
Figure 19:
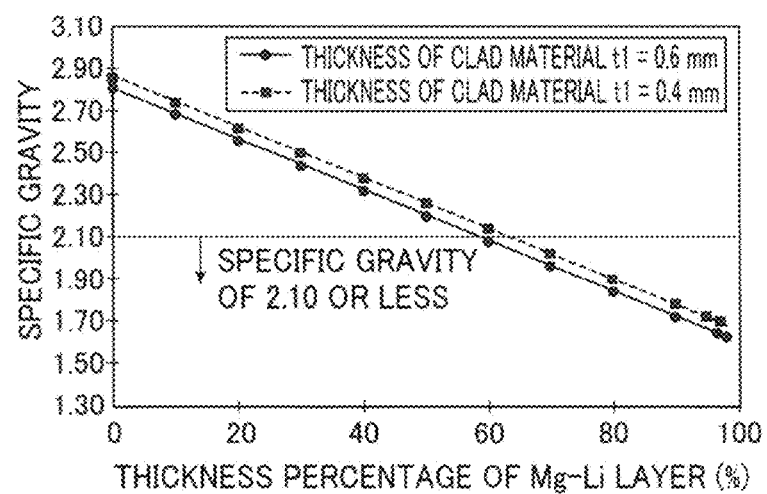
FIG. 19 A graph showing the specific gravity of a clad material with respect to the thickness percentage of a Mg—Li layer in the simulation conducted in order to confirm the effect of the present invention.
Figure 20:
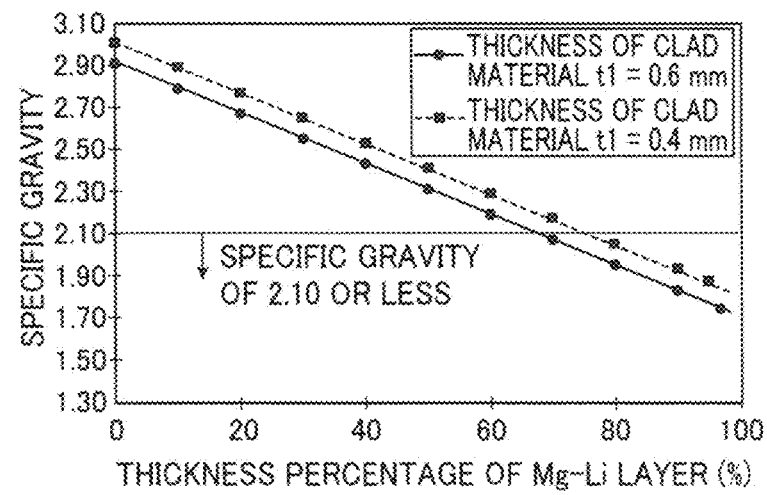
FIG. 20 A graph showing the specific gravity of a clad material with respect to the thickness percentage of a Mg—Li layer in the simulation conducted in order to confirm the effect of the present invention.

FIGS. 18 to 20 show the specific gravity of the clad material 210 with respect to the thickness percentage of the Mg—Li layer 211 in the cases where the thickness t14 of the bonding portion 213 and the thickness t16 of the bonding portion 215 are 1 μm, 5 μm, and 10 μm, respectively. In the case where the thicknesses t14 and t16 are 1 μm as shown in FIG. 18 and the thickness t11 of the clad material 210 is 0.6 mm, it has been proved that the specific gravity of the clad material 210 is 2.10 or less when the thickness percentage of the Mg—Li layer 211 is about 50% or more. From this, it has been proved that when the thickness t11 of the clad material 210 is 0.6 mm, the specific gravity of the clad material 210 can be reduced to 2.10 or less while the bonding strength is sufficiently ensured from the above results of the debonding test even if the thickness percentage of the Mg—Li layer 211 is reduced to about 50% in order to reduce the amount of the Mg—Li base alloy (LZ91) used. As shown in FIG. 18, it has been proved that when the thickness t1 is 0.4 mm, the thickness percentage of the Mg—Li layer 211 is set to about 53% or more such that the specific gravity of the clad material 210 can be reduced to 2.10 or less while the bonding strength is sufficiently ensured.

In the case where the thicknesses t14 and t16 are 10 μm as shown in FIG. 20 and the thickness t1 is 0.6 mm, it has been proved that the specific gravity of the clad material 210 is 2.10 or less when the thickness percentage of the Mg—Li layer 211 is about 72% or more. From this, it has been proved that the thickness percentage of the Mg—Li layer 211 is set to about 67% or more such that the specific gravity of the clad material 210 can be reduced to 2.10 or less even if the thicknesses t14 and t16 are 10 μm and the thicknesses of the bonding portions 213 and 215 are sufficiently ensured. Consequently, it has been confirmable that even if the thicknesses t14 and t16 are increased such that the bonding portions 213 and 215 are layered on the bonding interfaces Ia and Ib between the Mg—Li layer 211 and the Al layers 212 and 214, respectively, the thickness percentage of the Mg—Li layer 211 is increased such that the specific gravity of the clad material 210 can be reduced to 2.10 or less. As shown in FIG. 20, it has been proved that when the thickness t1 is 0.4 mm, the thickness percentage of the Mg—Li layer 211 is set to about 74% or more such that the specific gravity of the clad material 210 can be reduced to 2.10 or less. Furthermore, even if the thicknesses t14 and t16 are increased to more than 10 μm, the specific gravity of the clad material 210 can conceivably be set to 2.10 or less by adjusting the thickness percentage of the Mg—Li layer 211.

In the case where the thicknesses t14 and t16 are 5 μm as shown in FIG. 19 and the thickness t1 is 0.6 mm, it has been proved that the specific gravity of the clad material 210 is 2.10 or less when the thickness percentage of the Mg—Li layer 211 is about 59% or more. Furthermore, in the case where the thickness t1 is 0.4 mm, it has been proved that the specific gravity of the clad material 210 is 2.10 or less when the thickness percentage of the Mg—Li layer 211 is about 62% or more.

Modifications

The embodiments and Examples disclosed this time must be considered as illustrative in all points and not restrictive. The range of the present invention is shown not by the above description of the embodiments and Examples but by the scope of claims for patent, and all modifications within the meaning and range equivalent to the scope of claims for patent are further included.

For example, while the example in which the clad material 10 is a clad material in which the Mg—Li layer 11 and the Al layer 12 (second layer) are stacked in this order and the bonding portion 13 (first bonding portion) is arranged on the bonding interface Ia between the Mg—Li layer 11 and the Al layer 12 has been shown in the aforementioned first embodiment, and the example in which the clad material 210 is a clad material in which the Al layer 214 (third layer), the Mg—Li layer 211 (first layer), and the Al layer 212 (second layer) are stacked in this order and the bonding portion 213 (first bonding portion) and the bonding portion 215 (second bonding portion) are arranged on the bonding interface Ia between the Mg—Li layer 211 and the Al layer 212 and the bonding interface Ib between the Mg—Li layer 211 and the Al layer 214, respectively, has been shown in each of the aforementioned second embodiment and Examples, the present invention is not restricted to this. According to the present invention, the clad material may include another metal layer so far as the same has a structure in which the first layer and the second layer are stacked and the first bonding portion is arranged on the bonding interface between the first layer and the second layer. For example, in the clad material according to the present invention, another metal may be bonded to a surface of the second layer on a side opposite to the first layer.

While the example in which the clad material 10 is used for the housing 1 of the electronic device 100 has been shown in the aforementioned first embodiment, the present invention is not restricted to this. The clad material according to the present invention may be used for a structural member such as a motor vehicle or a bike other than the housing of the electronic device. In this case, the clad material according to the present invention is preferably used particularly for a member requiring reduction in weight.

While the example in which the bonding portions 13 (213) and 215 (island-shaped portions 13a (213a) and 215a) are arranged dispersedly over the entire bonding interfaces Ia and Ib, respectively has been shown in the aforementioned first and second embodiments and Examples, the present invention is not restricted to this. According to the present invention, the first (second) bonding portion may be arranged only on a portion of the bonding interface. For example, the clad material according to the present invention may not be of an overlay type but may be of an inlay type in which the bonding portion is arranged only on a portion of the bonding interface. At this time, the bonding portion is formed only on a peripheral edge excluding a central portion such that debonding of the first layer and the second layer (third layer) from each other can conceivably be effectively suppressed. Furthermore, the bonding portion may not be island-shaped. In other words, the bonding portion may be layered so far as the specific gravity of the clad material is 2.10 or less.

DESCRIPTION OF REFERENCE NUMERALS

1: housing (electronic device housing)
10, 210: clad material
11, 211: Mg—Li layer (first layer)
12, 212: Al layer (second layer)
13, 213: bonding portion (first bonding portion)
100: electronic device 214: Al layer (third layer)
215: bonding portion (second bonding portion)
Ia: bonding interface (between the first layer and the second layer)
Ib: bonding interface (between the first layer and the third layer)

The invention claimed is:

1. A clad material formed of rolled plural layers comprising:
 a first layer made of a Mg—Li base alloy;
 a second layer made of an Al base alloy; and
 a first bonding portion arranged on a bonding interface between the first layer and the second layer in a section view when cut in a thickness direction and made of a Cu base alloy,
 the clad material having a specific gravity of 2.10 or less,
 the first bonding portion is arranged in an island shape on the bonding interface, the island shape having been formed through fracturing a continuous layer in a rolling operation.

2. The clad material according to claim 1, wherein the first bonding portion is arranged on 10% or more and 90% or less of the bonding interface in the section view.

3. The clad material according to claim 2, wherein the first bonding portion is arranged on 20% or more and 80% or less of the bonding interface in the section view.

4. The clad material according to claim 1, wherein a thickness of the first bonding portion in the section view is 0.5 μm or more and 6 μm or less.

5. The clad material according to claim 1, wherein a thickness of the first layer in the section view is 60% or more and 90% or less of a thickness of the clad material.

6. The clad material according to claim 1, wherein a peel strength between the first layer and the first bonding portion is 1.0 N/mm or more.

7. The clad material according to claim 1, further comprising:
 a third layer bonded to a surface of the first layer on a side opposite to the second layer and made of an Al base alloy; and
 a second bonding portion arranged on a bonding interface between the first layer and the third layer in the section view and made of a Cu base alloy.

8. The clad material according to claim 1, wherein the Mg—Li base alloy of which the first layer is made contains 6 mass % or more and 15 mass % or less of Li.

9. An electronic device housing made of a clad material formed of rolled plural layers comprising:
 a first layer made of a Mg—Li base alloy;
 a second layer made of an Al base alloy; and
 a first bonding portion arranged on a bonding interface between the first layer and the second layer in a section view when cut in a thickness direction and made of a Cu base alloy,
 the clad material having a specific gravity of 2.10 or less,
 the first bonding portion is arranged in an island shape on the bonding interface, the island shape having been formed through fracturing a continuous layer in a rolling operation.

* * * * *